(12) United States Patent
Wang et al.

(10) Patent No.: US 11,343,018 B2
(45) Date of Patent: May 24, 2022

(54) POLAR CODE INTERLEAVING PROCESSING METHOD AND APPARATUS

(71) Applicant: Huawei Technologies Co., Ltd., Shenzhen (CN)

(72) Inventors: Guijie Wang, Hangzhou (CN); Gongzheng Zhang, Hangzhou (CN); Rong Li, Hangzhou (CN); Wei Chen, Hangzhou (CN); Jun Wang, Hangzhou (CN); Chen Xu, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 105 days.

(21) Appl. No.: 16/717,777

(22) Filed: Dec. 17, 2019

(65) Prior Publication Data

US 2020/0127761 A1  Apr. 23, 2020

Related U.S. Application Data

(63) Continuation of application No. PCT/CN2018/091836, filed on Jun. 19, 2018.

(30) Foreign Application Priority Data

Jun. 17, 2017  (CN) .......................... 201710459780.X

(51) Int. Cl.
*H04L 1/00* (2006.01)

(52) U.S. Cl.
CPC .......... *H04L 1/0057* (2013.01); *H04L 1/0067* (2013.01); *H04L 1/0071* (2013.01)

(58) Field of Classification Search
CPC ... H04L 1/0057; H04L 1/0067; H04L 1/0071; H04L 1/005; H04L 1/006; H04L 1/0065
See application file for complete search history.

(56) References Cited

U.S. PATENT DOCUMENTS

| 5,218,020 A | 6/1993 | Tung et al. |
| 8,171,374 B2 | 5/2012 | Miyazaki |
| (Continued) | | |

FOREIGN PATENT DOCUMENTS

| CA | 2943041 C | 12/2018 |
| CN | 1335722 A | 2/2002 |
| (Continued) | | |

OTHER PUBLICATIONS

Xie Qiuliang et al., "Bit-interleaved LDPC coded modulation with iterative demapping and decoding," Total 4 pages (2009) With English abstract.

(Continued)

*Primary Examiner* — Chandrahas B Patel
(74) *Attorney, Agent, or Firm* — Leydig, Voit & Mayer, Ltd.

(57) ABSTRACT

This application discloses a polar code interleaving processing method and apparatus. The method includes: determining N to-be-encoded bits, where N is a positive integer; obtaining a first sequence that includes sequence numbers of N polarized channels, where the first sequence is used to indicate a reliability order of the N polarized channels; performing polar encoding on the N to-be-encoded bits to (Continued)

obtain encoded bits; and performing interleaving processing on the encoded bits based on the first sequence. Because the first sequence used to indicate the reliability of the polarized channels is a sequence already existing in a polar code encoding process, no additional storage resource needs to be used to store the first sequence in the interleaving processing process, thereby reducing use of storage resources.

20 Claims, 8 Drawing Sheets

(56) References Cited

U.S. PATENT DOCUMENTS

| | | | |
|---|---|---|---|
| 8,498,357 | B2 | 7/2013 | Jung et al. |
| 9,300,517 | B2 | 3/2016 | Park et al. |
| 9,769,591 | B2 | 9/2017 | Nguyen et al. |
| 9,819,445 | B1 | 11/2017 | Patel |
| 9,893,842 | B2 | 2/2018 | Eder et al. |
| 10,305,633 | B2 | 5/2019 | Manolakos et al. |
| 10,355,820 | B2* | 7/2019 | Park ........................ H03M 13/27 |
| 10,595,311 | B2 | 3/2020 | Gupta et al. |
| 10,680,764 | B2 | 6/2020 | Young et al. |
| 10,728,080 | B2* | 7/2020 | Sankar ................ H03M 13/356 |
| 2002/0199147 | A1 | 12/2002 | Kim et al. |
| 2003/0081690 | A1 | 5/2003 | Kim et al. |
| 2003/0159100 | A1 | 8/2003 | Buckley et al. |
| 2007/0002969 | A1 | 1/2007 | Jeong et al. |
| 2008/0219387 | A1 | 9/2008 | Choi et al. |
| 2009/0060094 | A1 | 3/2009 | Jung et al. |
| 2009/0063929 | A1 | 3/2009 | Jeong et al. |
| 2009/0100300 | A1 | 4/2009 | Kim et al. |
| 2009/0249166 | A1 | 10/2009 | Miki et al. |
| 2011/0142163 | A1 | 6/2011 | Kwon et al. |
| 2013/0117622 | A1 | 5/2013 | Blankenship et al. |
| 2014/0177756 | A1 | 6/2014 | Park et al. |
| 2015/0131427 | A1 | 5/2015 | Han et al. |
| 2015/0263825 | A1 | 9/2015 | Kim et al. |
| 2016/0380763 | A1 | 12/2016 | Ahn et al. |
| 2017/0012740 | A1 | 1/2017 | Shen et al. |
| 2017/0086220 | A1 | 3/2017 | Kim et al. |
| 2017/0264394 | A1 | 9/2017 | Shen et al. |
| 2017/0338996 | A1 | 11/2017 | Sankar et al. |
| 2018/0026663 | A1* | 1/2018 | Wu ................... H03M 13/6362 714/776 |
| 2018/0035427 | A1 | 2/2018 | Gupta et al. |
| 2018/0083736 | A1 | 3/2018 | Manolakos et al. |
| 2018/0152205 | A1 | 5/2018 | Kim et al. |
| 2018/0212628 | A1 | 7/2018 | Chen et al. |
| 2018/0255589 | A1 | 9/2018 | Patil et al. |
| 2018/0278272 | A1 | 9/2018 | Li et al. |
| 2018/0351697 | A1 | 12/2018 | Kim et al. |
| 2019/0103883 | A1* | 4/2019 | Ye ........................ H04L 1/0042 |
| 2019/0190655 | A1 | 6/2019 | Pan et al. |
| 2019/0253199 | A1 | 8/2019 | Young et al. |
| 2019/0312679 | A1* | 10/2019 | Jayasinghe ......... H03M 13/095 |
| 2020/0007160 | A1* | 1/2020 | Li ..................... H03M 13/6561 |
| 2020/0119845 | A1 | 4/2020 | Chen et al. |
| 2020/0228236 | A1 | 7/2020 | Xi et al. |

FOREIGN PATENT DOCUMENTS

| | | |
|---|---|---|
| CN | 1433178 A | 7/2003 |
| CN | 101090305 A | 12/2007 |
| CN | 101119178 A | 2/2008 |
| CN | 101119182 A | 2/2008 |
| CN | 101325474 A | 12/2008 |
| CN | 101330351 A | 12/2008 |
| CN | 101442383 A | 5/2009 |
| CN | 101636938 A | 1/2010 |
| CN | 101911566 A | 12/2010 |
| CN | 102122966 A | 7/2011 |
| CN | 102835086 A | 12/2012 |
| CN | 102934383 A | 2/2013 |
| CN | 103023618 A | 4/2013 |
| CN | 103401571 A | 11/2013 |
| CN | 104067609 A | 9/2014 |
| CN | 105099622 A | 11/2015 |
| EP | 1748592 A2 | 1/2007 |
| EP | 2034649 A1 | 3/2009 |
| EP | 3113387 A1 | 1/2017 |
| EP | 3128782 A1 | 2/2017 |
| WO | 2015123842 A1 | 8/2015 |
| WO | 2016082142 A1 | 6/2016 |

OTHER PUBLICATIONS

Lei et al., "Demultiplexer Design for Multi-Edge Type LDPC Coded Modulation," ISIT 2009, Seoul, Korea, Total 5 pages (Jun. 28-Jul. 3, 2009).

"Bit interleaver for LDPC codes," 3GPP TSG RAN WG1 Meeting NR#3, R1-1715501, Nagoya, Japan, total 11 pages, 3rd Generation Partnership Project, Valbonne, France (Sep. 18-21, 2017).

"Text proposal for SMP (Symbol Mapping based on bit Priority)," TSG-RAN WG1 #23,Tdoc R1-02-0024, Espoo, Finland, total 6 pages, (Jan. 8-11, 2002).

"Polar Codes Contruction and Rate Matching Scheme," 3GPP TSG RAN WG1 Meeting #89, R1-1707183, Hangzhou, China, total 14 pages, 3rd Generation Partnership Project, Valbonne, France (May 15-19, 2017).

"LDPC parity check bits interleaver," 3GPP TSG RAN WG1 NR Ad Hoc Meeting, R1-xxxxx, Nagoya, Japan, total 4 pages, 3rd Generation Partnership Project, Valbonne, France (Sep. 18-21, 2017).

"Enhanced HARQ Method with Signal Constellation Rearrangement," TSG-RAN Working Group 1 Meeting #19, TSGR1#19(01)0237, Las Vegas, USA, total 11 pages, (Feb. 27-Mar. 2, 2001).

"3rd Generation Partnership Project; Technical Specification Group Radio Access Network; Evolved Universal Terrestrial Radio Access (E-UTRA); Physical channels and modulation (Release 14)," 3GPP TS 36.211 V14.3.0, total 195 pages, 3rd Generation Partnership Project, Valbonne, France (Jun. 2017).

Jia et al., "Enhanced HARQ Employing LDPC Coded Constellation Rearrangement with 64QAM," IEEE, Proc. 2006 International Conference on Communication Technology, total 4 pages, Institute of Electrical and Electronics Engineers, New York, New York (Nov. 2006).

"LDPC Rate Matching," 3GPP TSG-RAN WG1 #89ah, R1-1711212, Qingdao, China, total 6 pages, 3rd Generation Partnership Project, Valbonne, France (Jun. 27-30, 2017).

"Rate Matching Schemes for Polar Codes," 3GPP TSG-RAN WG1 #89, R1-1707075, Hangzhou, P.R. China, total 6 pages, 3rd Generation Partnership Project, Valbonne, France (May 15-19, 2017).

"3rd Generation Partnership Project;Technical Specification Group Radio Access Network; NR; Multiplexing and channel coding(Release 15)," 3GPP TS 38.212 V1.0.0, total 28 pages, 3rd Generation Partnership Project, Valbonne, France (Sep. 2017).

"WF on LDPC parity check matrices," 3GPP TSG RAN WG1 NR AH #2, R1-1711982, Qingdao, China, Agenda item 5.1.4.1.2, total 2 pages, 3rd Generation Partnership Project, Valbonne, France (Jun. 27-30, 2017).

"3rd Generation Partnership Project; Technical Specification Group Radio Access Network; Evolved Universal Terrestrial Radio Access (E-UTRA); Multiplexing and channel coding (Release 14)," 3GPP TS 36.212 V14.3.0, total 198 pages, 3rd Generation Partnership Project, Valbonne, France (Jun. 2017).

"On design of bit-level interleaver," 3GPP TSG-RAN WG1 Meeting #AH NR, R1-1713710, Prague, Czech, total 6 pages, 3rd Generation Partnership Project, Valbonne, France (Aug. 21-25, 2017).

Mackay et al.,"Information Theory, Inference, and Learning Algorithms—Convergence of iterative decoding," Electronics Letters, vol. 35, No. 10, pp. 806-808 (May 13, 1999).

"Design of multiple family LDPC codes," 3GPP TSG-RAN WG1 #88, R1-1702642, Athens, Greece, total 10 pages, 3rd Generation Partnership Project, Valbonne, France (Feb. 13-17, 2017).

(56) References Cited

OTHER PUBLICATIONS

"Bit-level interieaverof LDPC codes on high order modulation," 3GPP TSG RAN WG1 #90, R1-1714589, Prague, Czechia, total 15 pages, 3rd Generation Partnership Project, Valbonne, France (Aug. 21-25, 2017).

Stierstorfer et al., "Optimizing BICM with convolutional codes for transmission over the AWGN channel," Int. Zurich Seminar on Communications (IZS), total 5 pages, (Mar. 3-5, 2010).

"Bit Priority Mapping for LTE Shared TrCH Processing Chain," 3GPP TSG-RAN Working Group 1 #49,Tdoc R1-072270, Kobe, Japan, total 2 pages, 3rd Generation Partnership Project, Valbonne, France (May 7-11, 2007).

"Performance evaluation of LDPC codes for NR eMBB data," 3GPP TSG RAN WG1 Meeting #90, R1-1713740, Prague, Czech Republic, total 13 pages, 3rd Generation Partnership Project, Valbonne, France (Aug. 21-25, 2017).

"LDPC design for eMBB data," 3GPP TSG RAN WG1 NR Ad-Hoc Meeting, R1-1700092, Spokane, USA, total 17 pages, 3rd Generation Partnership Project, Valbonne, France (Jan. 16-20, 2017).

"3rd Generation Partnership Project; Technical Specification Group Radio Access Network; NR; Physical channels and modulation(Release 15)," 3GPP TS 38.211 V1.0.0, total 37 pages, 3rd Generation Partnership Project, Valbonne, France (Sep. 2017).

"LDPC design for eMBB data," 3GPP TSG RAN WG1 Meeting #88, R1-1701706, Athens, Greece, total 7 pages, 3rd Generation Partnership Project, Valbonne, France (Feb. 13-17, 2017).

Safavi et al., "Ultra Low Density Spread Transmission," IEEE Communications Letters, vol. 20, No. 7, XP011616351, pp. 1373-1376, Institute of Electrical and Electronics Engineers, New York, New York (Jul. 2016).

Zaidi et al., "Ericsson Technology 5G New Radio: Designing For The Future The 5G NR Physical Layer," Ericsson Technology Review, XP055780903, total 14 pages (Jul. 2017).

EP/18817981.6, Office Action, dated Jul. 1, 2021.

"Digital Video Broadcasting (DVB); Second generation framing structure, channel coding and modulation systems for Broadcasting, Interactive Services, News Gathering and other broadband satellite applications," ETSI EN 302 307 V1.1.2, XP014034070, total 74 pages (Jun. 2006).

IN/202037001706, Examination Report, dated Jun. 29, 2021.

Jin et al., "A Low Power Layered Decoding Architecture for LDPC Decoder Implementation for IEEE 802.11n LDPC Codes," Proceeding of the 13th international symposium on Low power electronics and design (ISLPED "08), pp. 253-258 (Aug. 11-13, 2008).

International Search Report for PCT/CN2018/091889; dated Aug. 30, 2018 (Year: 2018), 2 pages.

* cited by examiner

POLAR CODE INTERLEAVING PROCESSING METHOD AND APPARATUS

CROSS-REFERENCE TO RELATED APPLICATIONS

This application claims is a continuation of International Application No. PCT/CN2018/091836, filed on Jun. 19, 2018, which claims priority to Chinese Patent Application No. 201710459780.X, filed on Jun. 17, 2017. The disclosures of the aforementioned applications are hereby incorporated by reference in their entireties.

TECHNICAL FIELD

This application relates to the field of wireless communications technologies, and in particular, to a polar code interleaving processing method and apparatus.

BACKGROUND

With development of the 5th generation mobile communications technology (5-Generation, 5G), a polar code (Polar Codes) proposed by Arikan based on channel polarization are selected as a channel coding scheme, and the polar code has relatively low computational complexity in encoding and decoding.

In digital communication, channel coding is usually used to improve data transmission reliability. An interleaving module is added to channel coding, to further improve anti-interference performance. Specifically, on a plurality of compound channels, such as a shortwave channel and a troposcatter channel, in which random errors and burst errors concurrently occur, when one error occurs, the following string of data is affected, and consequently an error correcting capability deteriorates because burst errors exceed an error correcting capability of error-correcting codes. To improve system anti-interference performance, the burst errors are first discretized into random errors, and then the random errors are corrected. In actual application, the polar code is used to perform an interleaving operation at a transmit end and perform a de-interleaving operation at a receive end. The interleaving is performed to disrupt an original data sequence, so that correlation between the data sequence before interleaving and a data sequence after interleaving is reduced, impact of data burst errors is reduced, and anti-interference performance is improved.

In the prior art, a random interleaving manner is provided. When an interleaved sequence is computed offline in the random interleaving manner, a permutation sequence needs to be stored for interleaving and de-interleaving. A relatively large quantity of storage resources are required for storage of the permutation sequence in the random interleaving manner, and implementation is complex.

SUMMARY

Embodiments of this application provide a polar code interleaving processing method and apparatus, and a communications apparatus, so that storage resources used in an interleaving process are reduced, and implementation of interleaving processing is simple.

According to a first aspect, the present disclosure provides a polar code interleaving processing method, including:
determining N to-be-encoded bits, where N is a positive integer;
obtaining a first sequence that includes sequence numbers of N polarized channels, where the first sequence is used to indicate a reliability order of the N polarized channels;
performing polar encoding on the N to-be-encoded bits to obtain encoded bits; and
performing interleaving processing on the encoded bits based on the first sequence.

With reference to the first aspect, in a first possible implementation of the first aspect, the performing interleaving processing on the encoded bits based on the first sequence includes:
inputting elements in the first sequence into an interleaver to obtain an interleaved sequence; and
sorting the encoded bits based on the interleaved sequence to obtain interleaved bits.

With reference to the first aspect, in a second possible implementation of the first aspect, the performing interleaving processing on the encoded bits based on the first sequence includes:
sorting the encoded bits based on the first sequence to obtain sorted encoded bits; and
inputting the sorted encoded bits into an interleaver to obtain interleaved bits.

With reference to the second possible implementation of the first aspect, in a third possible implementation of the first aspect, the inputting the sorted encoded bits into an interleaver to obtain interleaved bits includes:
directly inputting the sorted encoded bits into the interleaver to obtain the interleaved bits.

With reference to the second possible implementation of the first aspect, in a fourth possible implementation of the first aspect, the inputting the sorted encoded bits into an interleaver to obtain interleaved bits includes:
performing rate matching on the sorted encoded bits to obtain rate-matched encoded bits; and
inputting the rate-matched encoded bits into the interleaver to obtain the interleaved bits.

With reference to the first aspect, in a fifth possible implementation of the first aspect, after the performing polar encoding on the N to-be-encoded bits to obtain encoded bits, the method further includes:
performing rate matching on the encoded bits to obtain rate-matched encoded bits; and
the performing interleaving processing on the encoded bits based on the first sequence includes:
sorting the rate-matched encoded bits based on a second sequence to obtain sorted encoded bits, where the second sequence is a sequence that has a length of M and that is obtained from the first sequence, M represents a length of target code output from a polar code, and M is a positive integer; and
inputting the sorted encoded bits into an interleaver to obtain interleaved bits.

With reference to the first aspect, in a sixth possible implementation of the first aspect, the performing interleaving processing on the encoded bits based on the first sequence includes:
determining, in the first sequence, a location of an information bit and a location of a non-information bit based on a quantity K of information bits in the N to-be-encoded bits, where K is a positive integer less than or equal to N;
inputting a first encoded bit at the location of the information bit in the encoded bits into a first interleaver to obtain a first interleaved bit; and
inputting a second encoded bit at the location of the non-information bit in the encoded bits into a second interleaver to obtain a second interleaved bit.

With reference to the first aspect, in a seventh possible implementation of the first aspect, after the performing polar encoding on the N to-be-encoded bits to obtain encoded bits, the method further includes:

performing rate matching on the encoded bits to obtain rate-matched encoded bits; and the performing interleaving processing on the encoded bits based on the first sequence includes:

determining, in the first sequence, a location of an information bit and a location of a non-information bit based on a quantity K of information bits in the N to-be-encoded bits, where K is a positive integer less than or equal to N;

inputting a first encoded bit at the location of the information bit in the rate-matched encoded bits into a first interleaver to obtain a first interleaved bit; and inputting a second encoded bit at the location of the non-information bit in the rate-matched encoded bits into a second interleaver to obtain a second interleaved bit.

With reference to the first aspect, in an eighth possible implementation of the first aspect, after the performing polar encoding on the N to-be-encoded bits to obtain encoded bits, the method further includes:

performing repetition encoding on the encoded bits to obtain (M−N) repeated bits, where M represents a length of target code output from a polar code, and M is a positive integer greater than N; and sorting the repeated bits based on the first sequence to obtain a second sorting result; and the performing interleaving processing on the encoded bits based on the first sequence includes:

sorting the encoded bits based on the first sequence to obtain a first sorting result;

The method further includes:

performing interleaving processing on the first sorting result and the second sorting result to obtain interleaved bits.

With reference to the eighth possible implementation of the first aspect, in a ninth possible implementation of the first aspect, $L=\lfloor M/N \rfloor$, and the sorting the repeated bits based on the first sequence to obtain a second sorting result includes:

when L=1, sorting the repeated bits based on a second sequence to obtain the second sorting result, where the second sequence is a sequence that has a length of M−N and that is obtained from the first sequence; or when L>1, dividing the repeated bits into L segments of repeated bits, sorting each segment of repeated bits in first (L−1) segments of repeated bits based on the first sequence, and sorting an $L^{th}$ segment of repeated bits based on a second sequence, where a length of each segment of repeated bits in the first (L−1) segments of repeated bits is N, a length of the $L^{th}$ segment of repeated bits is M−L*N, and the second sequence is a sequence that has a length of M−L*N and that is obtained from the first sequence.

With reference to the eighth or the ninth possible implementation of the first aspect, in a tenth possible implementation of the first aspect, the performing interleaving processing on the first sorting result and the second sorting result to obtain interleaved bits includes:

sequentially inputting the first sorting result and the second sorting result into an interleaver to obtain the interleaved bits.

With reference to the eighth or the ninth possible implementation of the first aspect, in an eleventh possible implementation of the first aspect, the performing interleaving processing on the first sorting result and the second sorting result to obtain interleaved bits includes:

inputting the first sorting result into a first interleaver to obtain a first interleaved bit; and inputting the second sorting result into a second interleaver to obtain a second interleaved bit, where the first interleaved bit and the second interleaved bit form the interleaved bits.

According to a second aspect, the present disclosure provides a polar code interleaving processing apparatus. The interleaving processing apparatus has a function of implementing behavior of an interleaving processing apparatus in the foregoing method example of the first aspect. The function may be implemented by hardware, or may be implemented by hardware executing corresponding software. The hardware or the software includes one or more modules corresponding to the function.

In a possible design, a structure of the interleaving processing apparatus includes a determining module, an obtaining module, a polar encoding module, and an interleaving module. These modules may perform corresponding functions in the foregoing method example. For details, refer to detailed descriptions of the method example, and details are not described herein again.

According to a third aspect, the present disclosure provides a communications apparatus, including:

a memory, configured to store a program; and a processor, configured to execute the program stored in the memory. When the program is executed, the processor is configured to perform any one of the first aspect or the possible implementations of the first aspect.

According to another aspect of this application, a computer readable storage medium is provided. The computer readable storage medium stores an instruction, and when the instruction is run on a computer, the computer performs the method in the foregoing aspects.

According to still another aspect of this application, a computer program product including an instruction is provided. When the computer program product is run on a computer, the computer performs the method in the foregoing aspects.

According to yet another aspect of this application, a computer program is provided. When the computer program is run on a computer, the computer performs the method in the foregoing aspects.

In the embodiments of the present disclosure, interleaving processing is performed, based on the first sequence, on the encoded bits obtained through polar code encoding. Because the first sequence used to indicate the reliability of the polarized channels is a sequence already existing in the polar code encoding process, no additional storage resource needs to be used to store the first sequence in the interleaving processing process, thereby reducing use of storage resources. In addition, interleaving processing is performed on the encoded bits based on the existing first sequence, so that implementation of interleaving processing is simple.

DESCRIPTION OF EMBODIMENTS

To make the objectives, technical solutions, and advantages of this application clearer, the following further describes this application in detail with reference to the accompanying drawings.

This application provides a polar code method and apparatus, to resolve a problem in the prior art that a large quantity of storage resources are occupied during interleaving processing. The method and the apparatus are conceived based on a same disclosure. The method and the apparatus have similar principles for resolving the problem. Therefore, for implementation of the apparatus and the method, reference may be made to each other, and details of repeated parts are not described.

Embodiments are described in this application with reference to an access terminal. The access terminal may also be referred to as a system, a subscriber unit, a subscriber station, a mobile station, a mobile console, a remote station, a remote terminal, a mobile device, a user terminal, a terminal, a wireless communications apparatus, a user agent, a user apparatus, or UE (User Equipment, user equipment). The access terminal may be a cellular phone, a cordless phone, a SIP (session initiation protocol) phone, a WLL (wireless local loop) station, a PDA (personal digital assistant), a handheld device having a wireless communication function, a computing device, or another processing device connected to a wireless modem. In addition, the embodiments are described with reference to a base station. The base station can be configured to communicate with a mobile device. The base station may be a BTS (base transceiver station) in GSM (Global System for Mobile Communications) or CDMA (Code Division Multiple Access); or may be an NB (NodeB) in WCDMA (Wideband Code Division Multiple Access); or may be an eNB or eNodeB (Evolutional Node B, evolved NodeB) in LTE (Long Term Evolution), a relay station or an access point, a base station device in a future 5G network, or the like.

Figure 1:
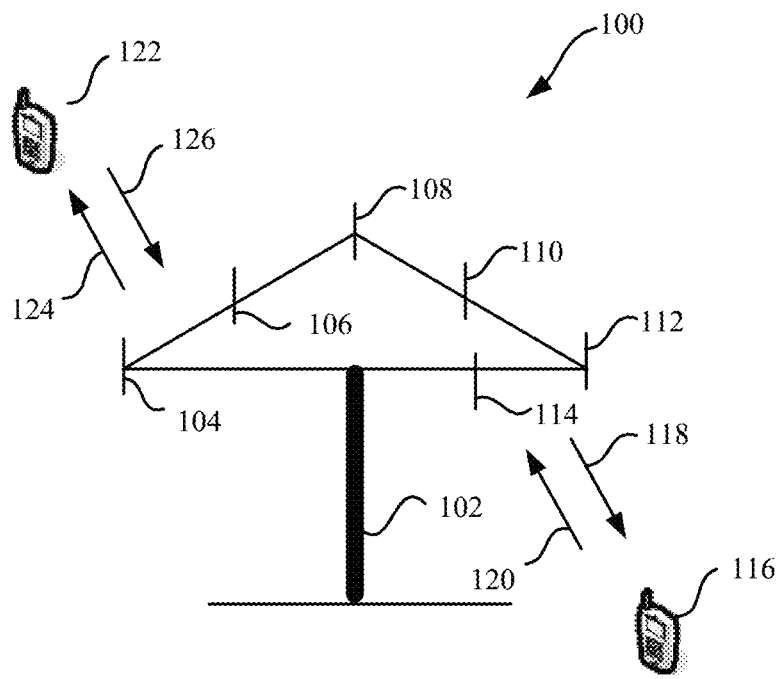
FIG. 1 is a structural diagram of a wireless communications system according to the present disclosure.

FIG. 1 shows a wireless communications system 100 according to the embodiments of this specification. The wireless communications system 100 includes a base station 102. The base station 102 may include a plurality of antenna groups. Each antenna group may include one or more antennas. For example, one antenna group may include antennas 104 and 106. Another antenna group may include antennas 108 and 110. An additional group may include antennas 112 and 114. For each antenna group, two antennas are shown in FIG. 1. However, more or fewer antennas may be used for each group. The base station 102 may additionally include a transmitter chain and a receiver chain. A person of ordinary skill in the art may understand that the transmitter chain and the receiver chain each may include a plurality of components (for example, a processor, a modulator, a multiplexer, a demodulator, a demultiplexer, or an antenna) related to signal sending and receiving.

The base station 102 may communicate with one or more access terminals (for example, an access terminal 116 and an access terminal 122). However, it may be understood that, the base station 102 may communicate with any quantity of access terminals similar to the access terminal 116 or the access terminal 122. The access terminals 116 and 122 each may be, for example, a cellular phone, a smartphone, a portable computer, a handheld communications apparatus, a handheld computing device, a satellite radio apparatus, a global positioning system, a PDA, and/or any other appropriate device configured to perform communication in the wireless communications system 100. As shown in FIG. 1, the access terminal 116 communicates with the antennas 112 and 114. The antennas 112 and 114 send information to the access terminal 116 on a forward link 118, and receive information from the access terminal 116 on a reverse link 120. In addition, the access terminal 122 communicates with the antennas 104 and 106. The antennas 104 and 106 send information to the access terminal 122 on a forward link 124 and receive information from the access terminal 122 on a reverse link 126. For example, in an FDD (Frequency Division Duplex) system, the forward link 118 may use a frequency band different from that used by the reverse link 120, and the forward link 124 may use a frequency band different from that used by the reverse link 126. In addition, in a TDD (Time Division Duplex) system, the forward link 118 and the reverse link 120 may use a common frequency band, and the forward link 124 and the reverse link 126 may use a common frequency band.

Each group of antennas and/or each area that are/is designed for communication are/is referred to as a sector of the base station 102. For example, the antenna group may be designed to communicate with an access terminal in a sector in coverage of the base station 102. In a process in which base station 102 communicates with the access terminals 116 and 122 by respectively using the forward links 118 and 124, transmit antennas of the base station 102 may use beamforming to increase signal-to-noise ratios of the forward links 118 and 124. In addition, compared with a manner in which a base station uses a single antenna to send signals to all access terminals served by the base station, when the base station 102 uses beamforming to send signals to the access terminals 116 and 122 that are randomly scattered in the related coverage, interference to a mobile device in a neighboring cell is less.

Within a specified time, the base station 102, the access terminal 116, or the access terminal 122 may be a wireless communications sending apparatus and/or a wireless communications receiving apparatus. When sending data, the wireless communications sending apparatus may encode the data for transmission. For example, the wireless communications sending apparatus may obtain (for example, generate, receive from another communications apparatus, or store in a memory) a particular quantity of data bits that need to be sent to the wireless communications receiving apparatus through a channel. The data bits may be included in a transport block (or a plurality of transport blocks) of the data, and the transport block may be segmented to generate a plurality of code blocks. In addition, the wireless communications sending apparatus may encode each code block by using a polar code encoder (not shown).

Figure 2:
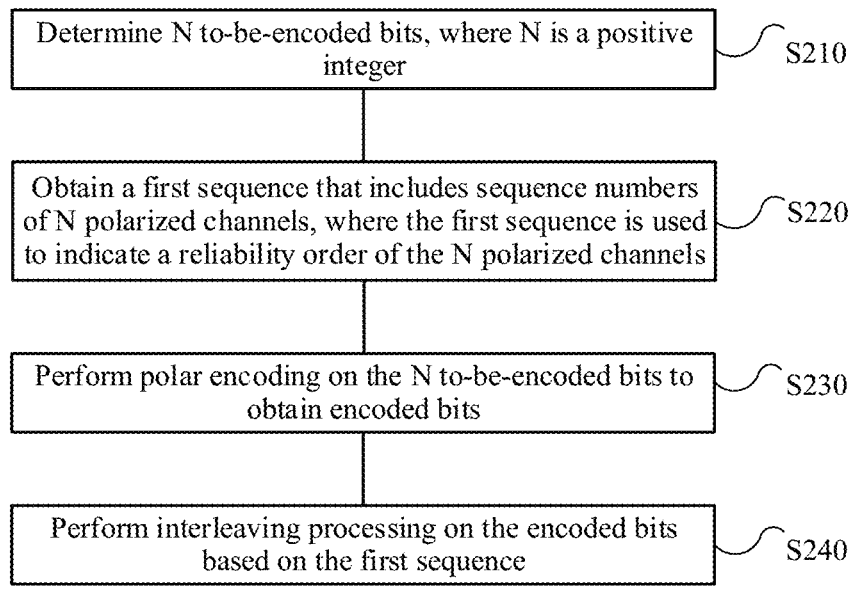
FIG. 2 is a flowchart of a polar polar code interleaving processing method according to an embodiment of the present disclosure.

FIG. 2 is a flowchart of a polar polar code interleaving processing method according to this application. The interleaving processing method includes the following steps.

S210. Determine N to-be-encoded bits, where N is a positive integer.

Specifically, N may be determined based on M, where M represents a length of target code output from a polar code, and M is equal to a positive integral power of 2.

For a scenario in which rate matching is not performed, N=M. For a scenario in which rate matching is performed, $N=2^{\lceil log_2 M \rceil}$, where the symbol ⌈ ⌉ indicates rounding up to a next integer.

S220. Obtain a first sequence that includes sequence numbers of N polarized channels, where the first sequence is used to indicate a reliability order of the N polarized channels.

In an embodiment, reliability of the N polarized channels may be first calculated, and then the polarized channels are sorted based on magnitude of the reliability, to obtain the first sequence used to indicate the reliability of the N polarized channels, where elements in the first sequence are used to indicate the sequence numbers of the polarized channels.

It should be noted that the magnitude of the reliability may be reflected by using an error probability, a mutual information amount, a polarization weight, or the like. This is not limited in the present disclosure.

In another embodiment, different first sequences corresponding to different values of N may be pre-stored in a form of a table in a memory. In this way, the first sequence that includes the sequence numbers of the N polarized channels can be obtained by querying the memory without online calculation. In other words, a first sequence corresponding to a length N of a current mother code is obtained.

In still another embodiment, a maximum reliability sequence corresponding to a maximum mother code length $N_{max}$ may be stored in a memory, and a first sequence corresponding to a length N of a current mother code is determined based on the maximum reliability sequence, where the maximum reliability sequence is used to indicate a reliability order of $N_{max}$ polarized channels, and $N_{max}$ is a positive integer greater than N.

S230. Perform polar encoding on the N to-be-encoded bits to obtain encoded bits.

Specifically, an encoding process of the to-be-encoded bits may be completed by using a polar code encoding matrix $F_N$, to obtain the encoded bits after polar encoding.

S240. Perform interleaving processing on the encoded bits based on the first sequence.

Figure 3:
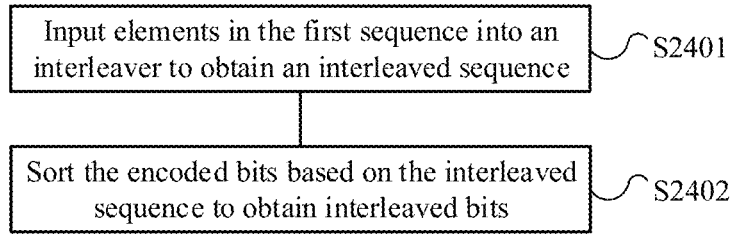
FIG. 3 is an implementation flowchart of step S240 in a procedure of an interleaving processing method according to an embodiment of the present disclosure.

In an embodiment of the present disclosure, as shown in FIG. 3, the performing interleaving processing on the encoded bits based on the first sequence in step S240 includes the following steps:

S2401. Input elements in the first sequence into an interleaver to obtain an interleaved sequence.

In this embodiment of the present disclosure, the interleaver may be specifically a row-column interleaver. A dimension of the row-column interleaver may be determined based on a modulation order. For example, a quantity of rows or columns of the row-column interleaver is equal to $log_2(Mod)$, where Mod is used to indicate the modulation order. For example, when Mod=16, a quantity of rows of the row-column interleaver is equal to 4, and when Mod=64, a quantity of rows of the row-column interleaver is equal to 6.

Further, in this embodiment of the present disclosure, a plurality of reading manners may be used in the interleaver, for example, a row-in-column-out manner, a row-in-row-out manner, a column-in-row-out manner or a column-in-column-out manner, a row-in-column-zigzag reading manner, and a column-in-column-zigzag reading manner, where the zigzag reading is used to indicate column-wise reading in a Z-shaped pattern. The following provides several examples of the reading manner of the interleaver.

Figure 4:
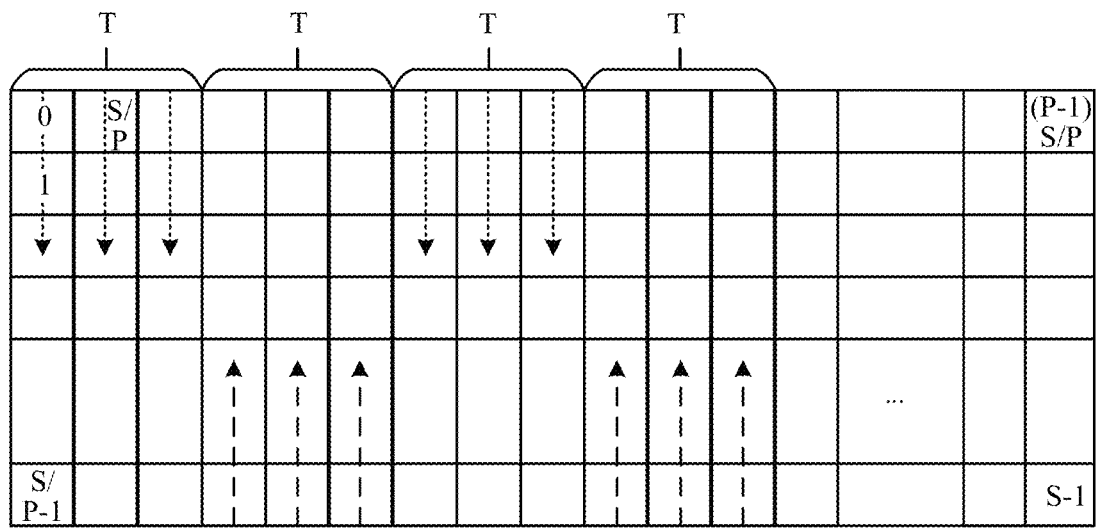
FIG. 4 is a row-column interleaver in which column-wise reading is performed by group according to the present disclosure.

FIG. 4 shows a row-column interleaver in which column-wise reading is performed by group. S represents a quantity of elements input into the row-column interleaver, and P represents a quantity of columns of the row-column interleaver. It can be learned from FIG. 4 that in a column-wise reading process, a reading sequence of columns is reversed every T columns, where T may be a constant, or may be related to the modulation order. For example, when the modulation order corresponds to 16QAM, T may be 1, 3, 5, or the like. For example, when the modulation order corresponds to 64QAM, T is 1, 5, 6, 32, or the like, and T is a positive integer not greater than (S/P).

Figure 5:
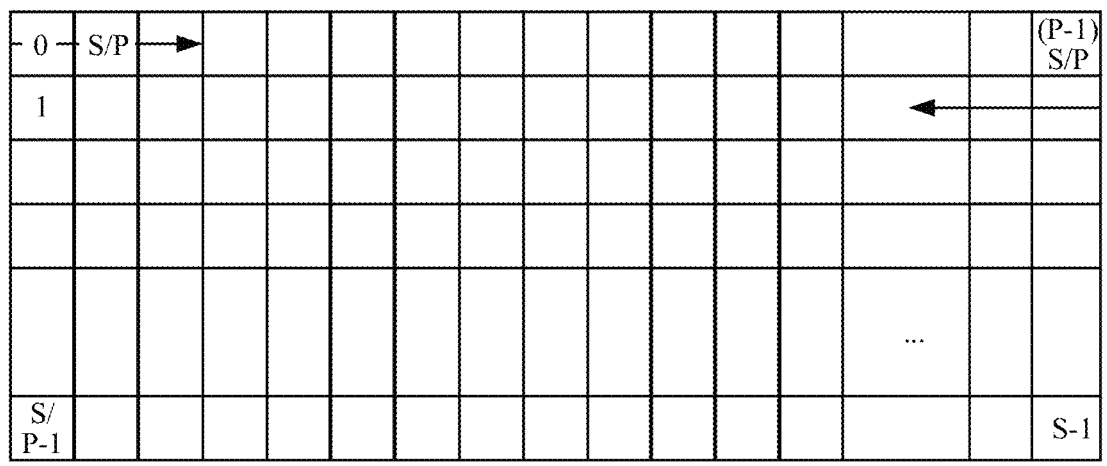
FIG. 5 is a row-column interleaver in which row-wise reading is performed according to the present disclosure.

FIG. 5 shows a row-column interleaver in which row-wise reading is performed. S represents a quantity of elements input into the row-column interleaver, and P represents a quantity of columns of the row-column interleaver. It can be learned from FIG. 5 that in a row-wise reading process, a reading sequence of the rows is reversed every other row, in other words, reading is performed from right to left in the figure. Actually, the reading sequence of rows may alternatively be reversed every T rows, and T is a positive integer not greater than (S/P).

Figure 6:
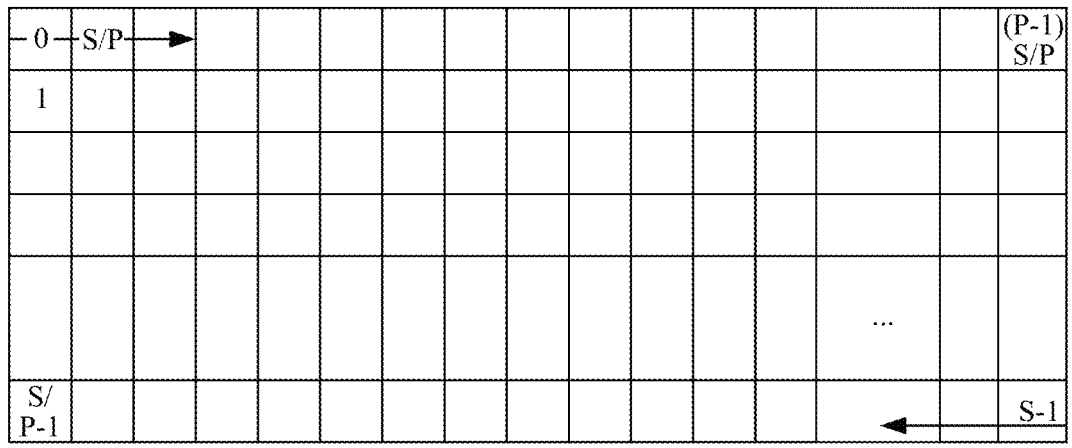
FIG. 6 is a row-column interleaver in which row-wise reading is performed from top and bottom to middle according to the present disclosure.

FIG. 6 shows a row-column interleaver in which row-wise reading is performed from top and bottom to middle. To be specific, after a top row is read, a bottom row is read, and then an unread top row is read, and so on, to complete reading from the entire row-column interleaver.

Figure 7:
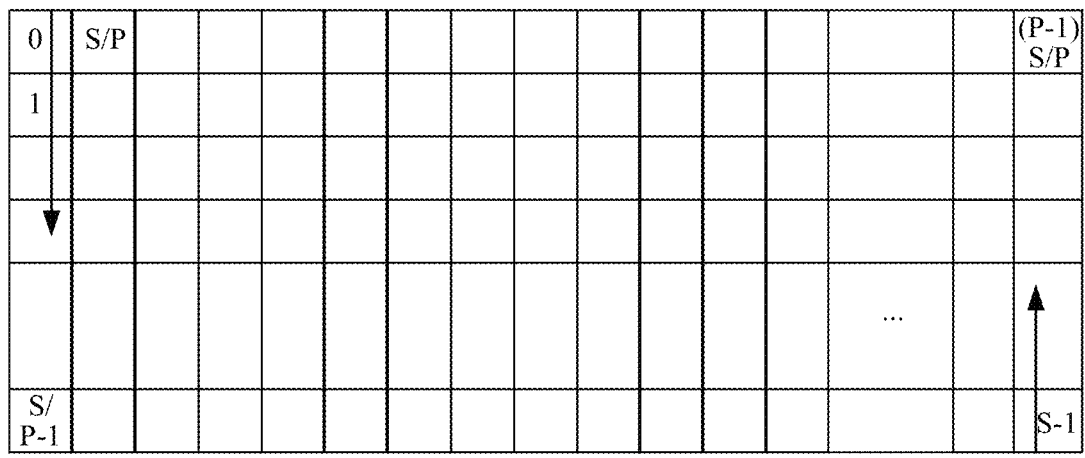
FIG. 7 is a row-column interleaver in which column-wise reading is performed from left and right to middle according to the present disclosure.

FIG. 7 shows a row-column interleaver in which column-wise reading is performed from left and right to middle. To be specific, after a leftmost column is read, a rightmost column is read, then an unread leftmost column is read, and so on, to complete reading from the entire row-column interleaver.

For the row-column interleaver implemented by reading column-wise, after a column is read, a cyclic shift is further performed on the column, a length of a cyclic shift performed on each column may be determined according to a function, for example, 5*i, or $f_1*i+f_2*i^2$, where i is a number of a currently read column, $f_1$ and $f_2$ are used function parameters.

It should be noted that the interleaver may be the row-column interleaver, or may be other interleavers such as a QPP interleaver, a congruential interleaver, an S-random interleaver, and specific implementation of the interleaver is not limited in the present disclosure.

S2402. Sort the encoded bits based on the interleaved sequence to obtain interleaved bits.

Specifically, the encoded bits obtained through polar code encoding are sorted based on the interleaved sequence to obtain the interleaved bits. The interleaved bits are output interleaved bits. For example, when the encoded bits are (1100), and the interleaved sequence is (1324), the output interleaved bits are (1010).

Figure 8:
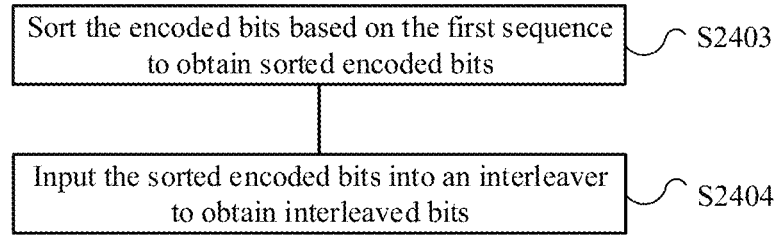
FIG. 8 is another implementation flowchart of step S240 in a procedure of an interleaving processing method according to an embodiment of the present disclosure.

In another embodiment of the present disclosure, as shown in FIG. 8, the performing interleaving processing on the encoded bits based on the first sequence in step S240 includes the following steps:

S2403. Sort the encoded bits based on the first sequence to obtain sorted encoded bits.

S2404. Input the sorted encoded bits into an interleaver to obtain interleaved bits.

In the embodiment corresponding to FIG. 8, for whether rate matching is performed on the sorted encoded bits, there are the following two scenarios:

For a scenario in which rate matching is not performed on the sorted encoded bits, the sorted encoded bits are directly input into the interleaver to obtain the interleaved bits.

For a scenario in which rate matching is performed on the sorted encoded bits, rate matching is first performed on the sorted encoded bits to obtain rate-matched encoded bits, and then the rate-matched encoded bits are input into the interleaver to obtain the interleaved bits.

It can be learned from the foregoing description that in the embodiment corresponding to FIG. 8, the encoded bits are first sorted, then whether to perform rate matching is considered, and finally the sorted encoded bits are input into the interleaver to obtain the interleaved bits. Actually, whether to perform rate matching on the encoded bits may be alternatively first considered, then the encoded bits are sorted, and finally the sorted encoded bits are input into the interleaver to obtain the interleaved bits. This case is described in the following embodiment corresponding to FIG. 9.

Figures 9, 10:
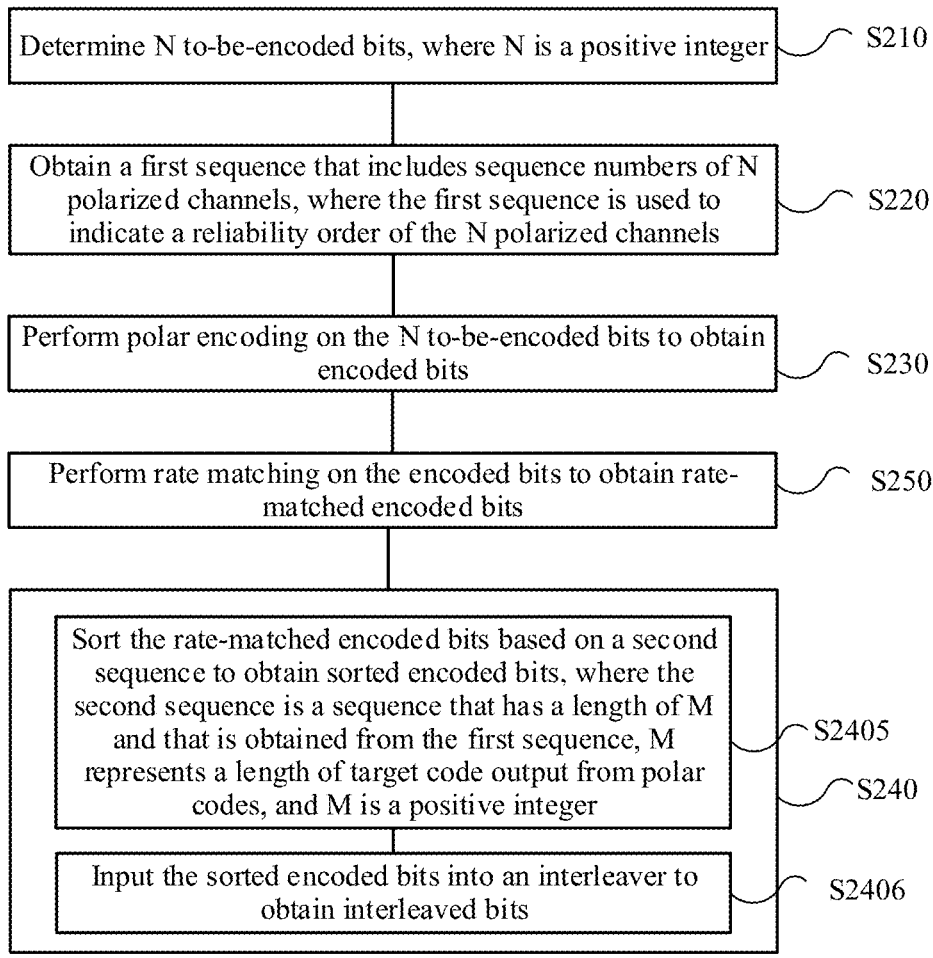
FIG. 9 is a flowchart of another polar polar code interleaving processing method according to an embodiment of the present disclosure.
FIG. 10 is still another implementation flowchart of step S240 in a procedure of an interleaving processing method according to an embodiment of the present disclosure.

In still another embodiment of the present disclosure, as shown in FIG. 9, after step S230, the interleaving processing method further includes the following step.

S250. Perform rate matching on the encoded bits to obtain rate-matched encoded bits.

Correspondingly, the performing interleaving processing on the encoded bits based on the first sequence in step S240 includes the following steps:

S2405. Sort the rate-matched encoded bits based on a second sequence to obtain sorted encoded bits, where the second sequence is a sequence that has a length of M and that is obtained from the first sequence, M represents a length of target code output from a polar code, and M is a positive integer.

S2406. Input the sorted encoded bits into an interleaver to obtain interleaved bits.

In still another embodiment of the present disclosure, as shown in FIG. 10, the performing interleaving processing on the encoded bits based on the first sequence in step S240 includes the following steps.

S2407. Determine, in the first sequence, a location of an information bit and a location of a non-information bit based on a quantity K of information bits in the N to-be-encoded bits, where K is a positive integer less than or equal to N.

It should be noted that the non-information bit is a bit other than the information bit.

S2408. Input a first encoded bit at the location of the information bit in the encoded bits into a first interleaver to obtain a first interleaved bit, and input a second encoded bit at the location of the non-information bit in the encoded bits into a second interleaver to obtain a second interleaved bit.

It should be noted that in the present disclosure, the first interleaver and the second interleaver may be a same interleaver, or may be different interleavers. For use of the first interleaver and the second interleaver, there are the following three possible cases:

1. When the first interleaver and the second interleaver are a same interleaver, in other words, only one interleaver is used, the first encoded bit and the second encoded bit are input as a whole into the interleaver, and an input sequence may be that the first encoded bit is located before the second encoded bit or that the first encoded bit is located after the second encoded bit. An unfilled location in the interleaver is correspondingly padded with a zero.

2. When the first interleaver and the second interleaver are different interleavers, in other words, two interleavers are used, the first encoded bit is input into the first interleaver, and an unfilled location in the first interleaver is correspondingly padded with a zero; and the second encoded bit is input into the second interleaver, and an unfilled location in the second interleaver is correspondingly padded with a zero.

3. When the first interleaver and the second interleaver are different interleavers, in other words, two interleavers are used, the first encoded bit is input into the first interleaver, and an unfilled location in the first interleaver is correspondingly padded with the second encoded bit; and a remaining second encoded bit is input into the second interleaver, and an unfilled location in the second interleaver is correspondingly padded with a zero.

A scenario in which rate matching is not performed on the encoded bits is described in the embodiment corresponding to FIG. 10. Correspondingly, a scenario in which rate matching is performed on the encoded bits is described in the following embodiment corresponding to FIG. 11.

Figure 11:
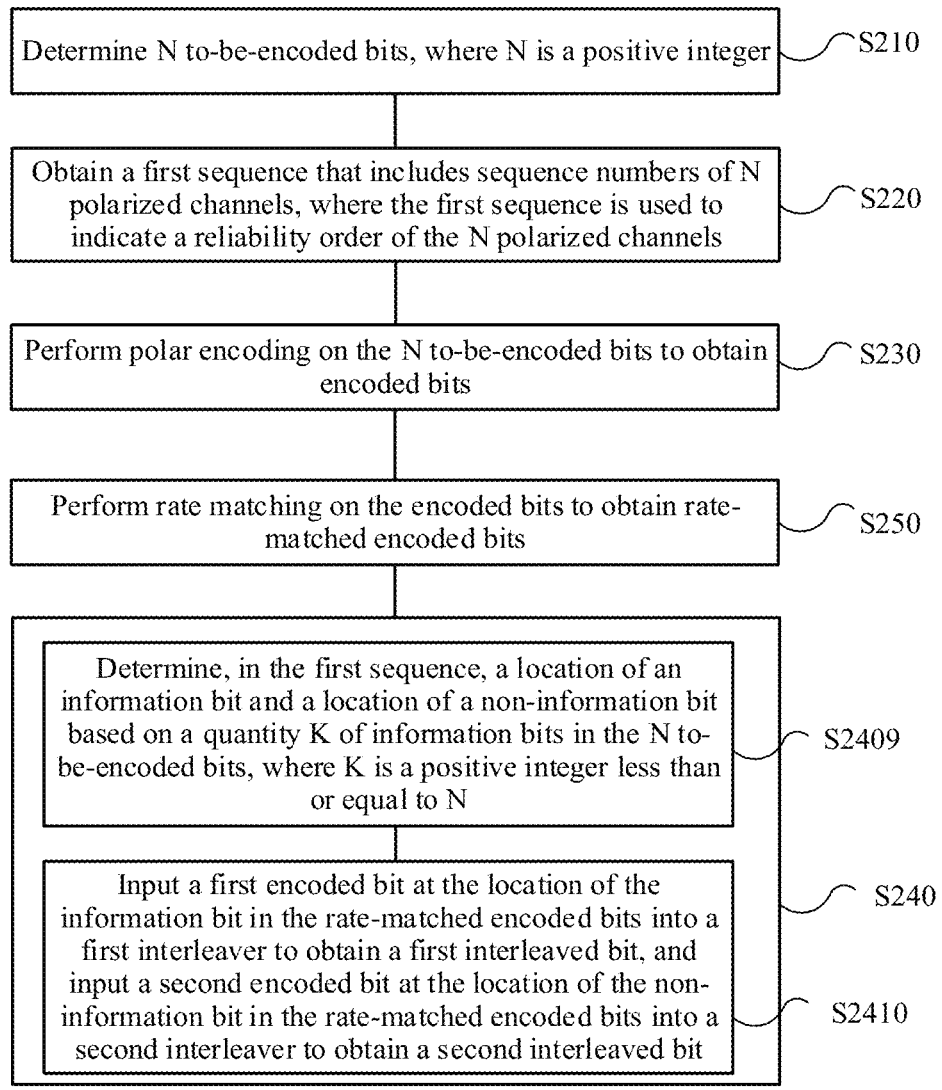
FIG. 11 is a flowchart of still another polar polar code interleaving processing method according to an embodiment of the present disclosure.

In still another embodiment of the present disclosure, as shown in FIG. 11, after step S230, the interleaving processing method further includes the following step:

S250. Perform rate matching on the encoded bits to obtain rate-matched encoded bits.

Correspondingly, the performing interleaving processing on the encoded bits based on the first sequence in step S240 includes the following steps:

S2409. Determine, in the first sequence, a location of an information bit and a location of a non-information bit based on a quantity K of information bits in the N to-be-encoded bits, where K is a positive integer less than or equal to N.

S2410. Input a first encoded bit at the location of the information bit in the rate-matched encoded bits into a first interleaver to obtain a first interleaved bit, and input a second encoded bit at the location of the non-information bit in the rate-matched encoded bits into a second interleaver to obtain a second interleaved bit.

It should be noted that the first interleaver and the second interleaver may be a same interleaver, or may be different interleavers.

Figure 12:
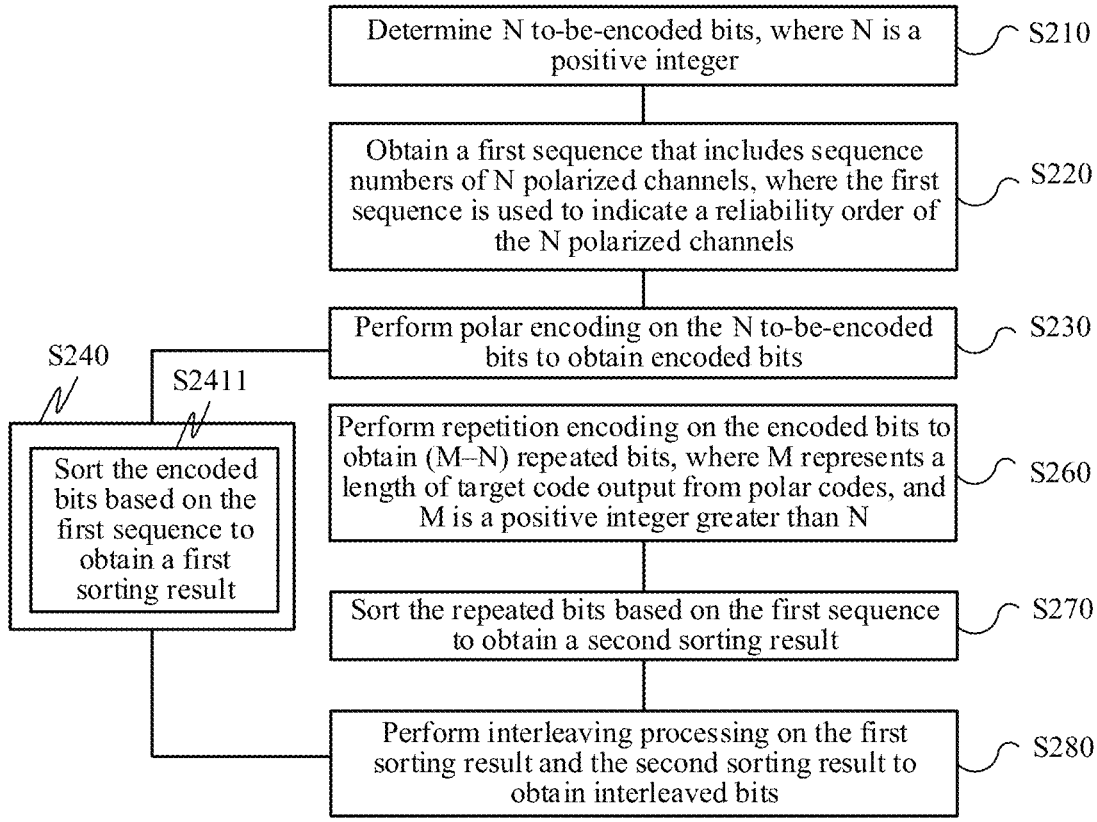
FIG. 12 is a flowchart of yet another polar polar code interleaving processing method according to an embodiment of the present disclosure.

In yet another embodiment of the present disclosure, as shown in FIG. 12, after the encoded bits are obtained in step S230, because a quantity of the encoded bits is less than a length M of target code output from a polar code, the length of the target code may be reached in a repetition encoding manner. Therefore, after step S230, the interleaving processing method further includes the following steps.

S260. Perform repetition encoding on the encoded bits to obtain (M-N) repeated bits, where M represents a length of target code output from a polar code, and M is a positive integer greater than N.

The repetition encoding is to extend the encoded bits to reach the target code length of M encoded bits. Specifically, a repetition encoding process may be as follows: (M-N) encoded bits are selected from the N encoded bits as repeated bits, and the N encoded bits and the (M-N) repeated bits reach the target code length of M encoded bits.

It should be noted that, how to select (M-N) encoded bits from the N encoded bits as repeated bits is not limited in the present disclosure.

S270. Sort the repeated bits based on the first sequence to obtain a second sorting result.

Specifically, $L = \lfloor M/N \rfloor$. When L=1, the (M-N) repeated bits are sorted based on a second sequence to obtain the second sorting result, where the second sequence is a sequence that has a length of M-N and that is obtained from the first sequence. Further, when M-N=N, in other words, the length of the second sequence is N, in this case, the second sequence is the same as the first sequence.

When L>1, the (M-N) repeated bits are divided into L segments of repeated bits, each segment of repeated bits in first (L-1) segments of repeated bits is sorted based on the first sequence, and an $L^{th}$ segment of repeated bits is sorted based on a second sequence, where a length of each segment of repeated bits in the first (L-1) segments of repeated bits is N, a length of the $L^{th}$ segment of repeated bits is M-L*N, and the second sequence is a sequence that has a length of M-L*N and that is obtained from the first sequence. Further, when the length of the $L^{th}$ segment of repeated bits is N, the length of the second sequence is N. In this case, the second sequence is the same as the first sequence.

Correspondingly, the performing interleaving processing on the encoded bits based on the first sequence in step S240 includes the following step.

S2411. Sort the encoded bits based on the first sequence to obtain a first sorting result.

After the first sorting result and the second sorting result are obtained, the interleaving processing method further includes the following step.

S280. Perform interleaving processing on the first sorting result and the second sorting result to obtain interleaved bits.

Specifically, the performing interleaving processing on the first sorting result and the second sorting result to obtain interleaved bits includes:

sequentially inputting the first sorting result and the second sorting result into an interleaver to obtain the interleaved bits; or inputting the first sorting result into a first interleaver to obtain a first interleaved bit, and inputting the second sorting result into a second interleaver to obtain a second interleaved bit, where the first interleaved bit and the second interleaved bit form the output interleaved bits.

It should be noted that the first interleaver and the second interleaver may be a same interleaver, or may be different interleavers.

In the foregoing embodiments, interleaving processing is performed, based on the first sequence, on the encoded bits obtained through polar code encoding. Because the first sequence used to indicate the reliability of the polarized channels is a sequence already existing in the polar code encoding process, no additional storage resource needs to be used to store the first sequence in the interleaving processing process, thereby reducing use of storage resources. In addition, interleaving processing is performed on the encoded bits based on the existing first sequence, so that implementation of interleaving processing is simple.

Figure 13:
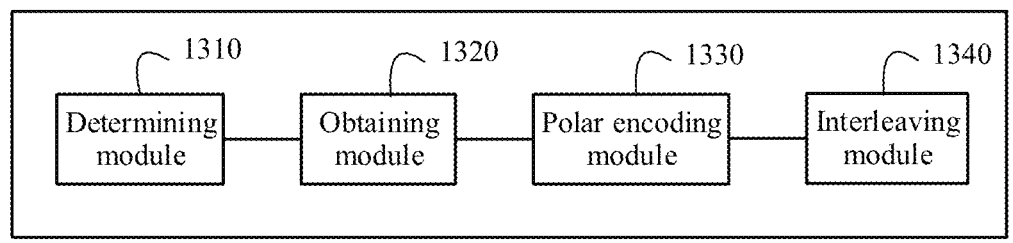
FIG. 13 is a structural diagram of a polar polar code interleaving processing apparatus according to an embodiment of the present disclosure.

The following describes a polar polar code interleaving processing apparatus 1300 provided in an embodiment of the present disclosure with reference to FIG. 13. The interleaving processing apparatus 1300 includes a determining module 1310, an obtaining module 1320, a polar encoding module 1330, and an interleaving module 1340.

The determining module 1310 is configured to determine N to-be-encoded bits, where N is a positive integer.

Specifically, N may be determined based on M, where M represents a length of target code output from a polar code, and M is equal to a positive integral power of 2. For a scenario in which rate matching is not performed, N=M. For a scenario in which rate matching is performed, $N=2^{\lceil log_2 M \rceil}$, where the symbol $\lceil \ \rceil$ indicates rounding up to a next integer.

The obtaining module 1320 is configured to obtain a first sequence that includes sequence numbers of N polarized channels, where the first sequence is used to indicate a reliability order of the N polarized channels.

The polar encoding module 1330 is configured to perform polar encoding on the N to-be-encoded bits to obtain encoded bits.

Specifically, an encoding process of the to-be-encoded bits may be completed by using a polar code encoding matrix $F_N$, to obtain the encoded bits after polar encoding.

The interleaving module 1340 is configured to perform interleaving processing on the encoded bits based on the first sequence.

In an embodiment of the present disclosure, the interleaving module 1340 is specifically configured to:

determine, in the first sequence, a location of an information bit and a location of a non-information bit based on a quantity K of information bits in the N to-be-encoded bits, where K is a positive integer less than or equal to N;

input a first encoded bit at the location of the information bit in the encoded bits into a first interleaver to obtain a first interleaved bit; and input a second encoded bit at the location of the non-information bit in the encoded bits into a second interleaver to obtain a second interleaved bit.

For use of the first interleaver and the second interleaver, refer to related descriptions in the method embodiments, and details are not described herein again.

Figure 14:
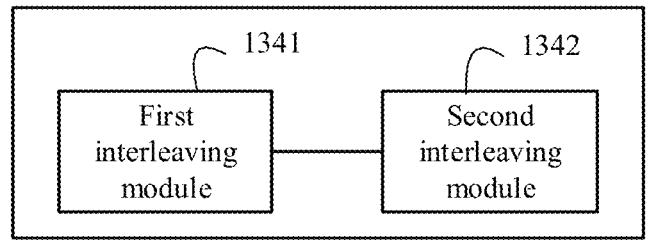
FIG. 14 is a structural diagram of an interleaving module in an interleaving processing apparatus according to an embodiment of the present disclosure.

In another embodiment of the present disclosure, as shown in FIG. 14, the interleaving module 1340 includes:

a first interleaving submodule 1341, configured to input elements in the first sequence into an interleaver to obtain an interleaved sequence; and a second interleaving submodule 1342, configured to sort the encoded bits based on the interleaved sequence to obtain interleaved bits.

In still another embodiment of the present disclosure, as shown in FIG. 14, the interleaving module 1340 includes:

a first interleaving submodule 1341, configured to sort the encoded bits based on the first sequence to obtain sorted encoded bits; and a second interleaving submodule 1342, configured to input the sorted encoded bits into an interleaver to obtain interleaved bits.

Further, the second interleaving submodule 1342 is specifically configured to:

directly input the sorted encoded bits into the interleaver to obtain the interleaved bits; or perform rate matching on the sorted encoded bits to obtain rate-matched encoded bits; and input the rate-matched encoded bits into the interleaver to obtain the interleaved bits.

Figure 15:
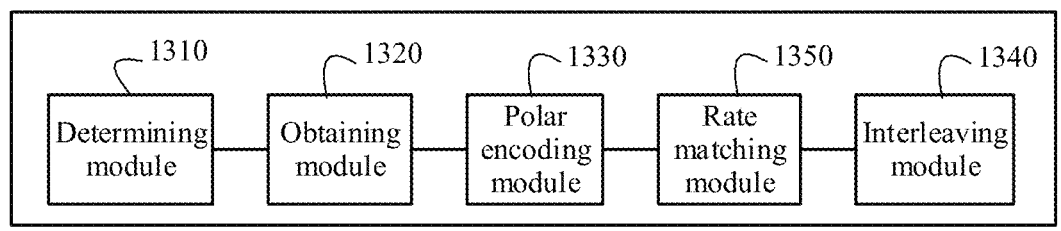
FIG. 15 is a structural diagram of another polar polar code interleaving processing apparatus according to an embodiment of the present disclosure.

In yet another embodiment of the present disclosure, as shown in FIG. 15, the interleaving processing apparatus 1300 further includes:

a rate matching module 1350, configured to perform rate matching on the encoded bits to obtain rate-matched encoded bits.

Correspondingly, the interleaving module 1340 is specifically configured to:

sort the rate-matched encoded bits based on a second sequence to obtain sorted encoded bits, where the second sequence is a sequence that has a length of M and that is obtained from the first sequence, M represents a length of target code output from a polar code, and M is a positive integer; and input the sorted encoded bits into an interleaver to obtain interleaved bits.

In still yet another embodiment of the present disclosure, as shown in FIG. 15, the interleaving processing apparatus 1300 further includes:

a rate matching module 1350, configured to perform rate matching on the encoded bits to obtain rate-matched encoded bits.

Correspondingly, the interleaving module 1340 is specifically configured to:

determine, in the first sequence, a location of an information bit and a location of a non-information bit based on a quantity K of information bits in the N to-be-encoded bits, where K is a positive integer less than or equal to N;

input a first encoded bit at the location of the information bit in the rate-matched encoded bits into a first interleaver to obtain a first interleaved bit; and input a second encoded bit at the location of the non-information bit in the rate-matched encoded bits into a second interleaver to obtain a second interleaved bit.

Figure 16:
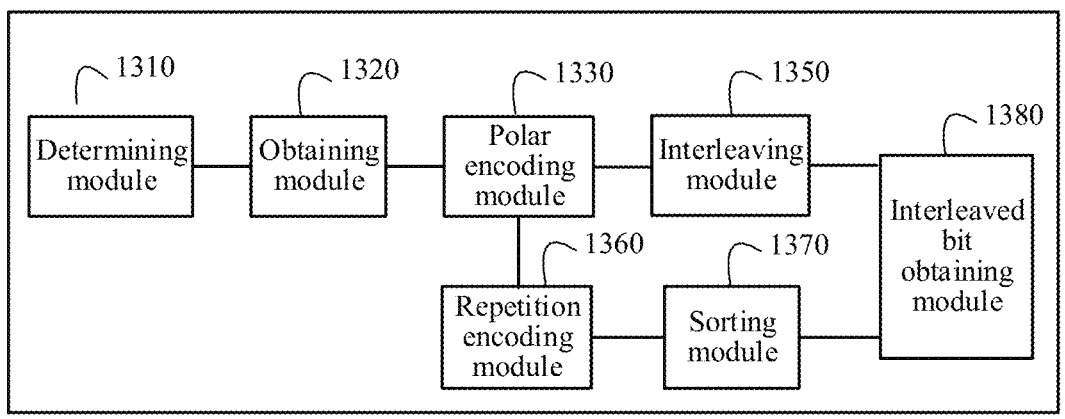
FIG. 16 is a structural diagram of still another polar polar code interleaving processing apparatus according to an embodiment of the present disclosure.

In a further embodiment of the present disclosure, as shown in FIG. 16, the interleaving module 1340 is specifically configured to:

sort the encoded bits based on the first sequence to obtain a first sorting result.

The interleaving processing apparatus 1300 further includes:

a repetition encoding module 1360, configured to perform repetition encoding on the encoded bits to obtain (M-N) repeated bits, where M represents a length of target code output from a polar code, and M is a positive integer greater than N;

a sorting module 1370, configured to sort the repeated bits based on the first sequence to obtain a second sorting result; and an interleaved bit obtaining module 1380, configured to perform interleaving processing on the first sorting result and the second sorting result to obtain interleaved bits.

Further, the sorting module 1370 is specifically configured to:

when L=1, sort the repeated bits based on a second sequence to obtain the second sorting result, where the second sequence is a sequence that has a length of M-N and that is obtained from the first sequence, and $L=\lfloor M/N \rfloor$; or when L>1, divide the repeated bits into L segments of repeated bits, sort each segment of repeated bits in first (L-1) segments of repeated bits based on the first sequence, and sort an $L^{th}$ segment of repeated bits based on a second sequence, where a length of each segment of repeated bits in the first (L-1) segments of repeated bits is N, a length of the $L^{th}$ segment of repeated bits is M-L*N, and the second sequence is a sequence that has a length of M-L*N and that is obtained from the first sequence.

Further, the interleaved bit obtaining module 1380 is specifically configured to:

sequentially input the first sorting result and the second sorting result into an interleaver to obtain the interleaved bits; or, input the first sorting result into a first interleaver to obtain a first interleaved bit, and input the second sorting result into a second interleaver to obtain a second interleaved bit, where the first interleaved bit and the second interleaved bit form the output interleaved bits.

In the foregoing embodiments, the polar code interleaving processing apparatus performs, based on the first sequence, interleaving processing on the encoded bits obtained through polar code encoding. Because the first sequence used to indicate the reliability of the polarized channels is a sequence already existing in the polar code encoding process, no additional storage resource needs to be used to store the first sequence in the interleaving processing process, thereby reducing use of storage resources. In addition, interleaving processing is performed on the encoded bits based on the existing first sequence, so that implementation of interleaving processing is simple.

Figure 17A:
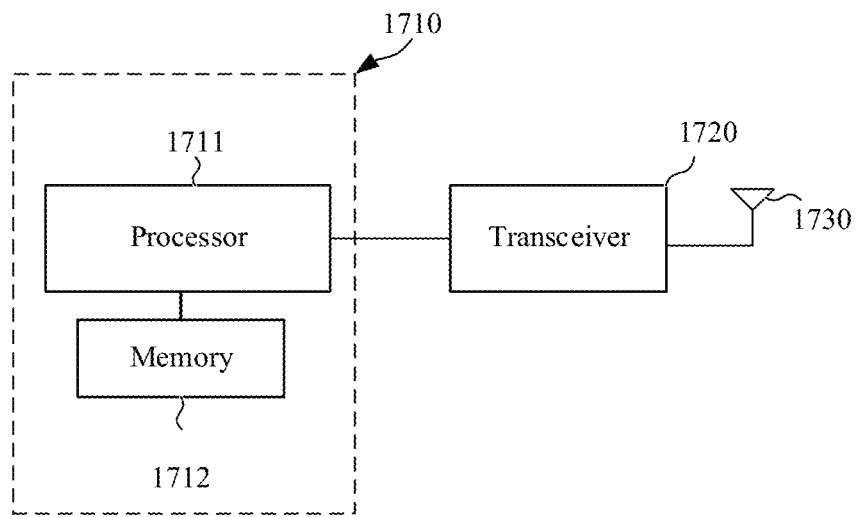
FIG. 17a is a structural diagram of a communications apparatus according to an embodiment of the present disclosure.

Referring to FIG. 17a, an embodiment of the present disclosure provides a communications apparatus 1700, configured to perform interleaving processing on encoded bits after polar code encoding. The communications apparatus 1700 includes:

a processing apparatus 1710, configured to process data received by a transceiver 1720; and the transceiver 1720, configured to receive or send data.

Optionally, the communications apparatus further includes:

an antenna 1730, where the antenna 1730 is specifically configured for the transceiver 1720 to receive or send data.

When the processing apparatus 1710 is implemented by using software, referring to FIG. 17a, the processing apparatus 1710 includes:

a memory 1712, configured to store a program; and a processor 1711, configured to execute the program stored in the memory. When the program is executed, the foregoing method embodiment such as the method embodiment corresponding to FIG. 2 or any one of FIG. 8 to FIG. 12 is implemented. For details, refer to descriptions in the foregoing method embodiments, and an execution process of the processor 1711 is not described herein again.

Figure 17B:
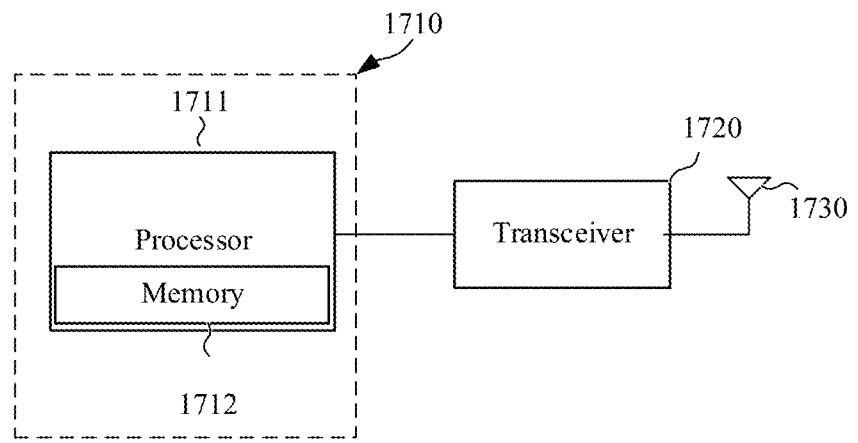
FIG. 17b is a structural diagram of another communications apparatus according to an embodiment of the present disclosure.

The memory 1712 may be a physically independent unit, or may be integrated with the processor 1711. Refer to FIG. 17b for details.

The communications apparatus in the embodiments of this application may be a wireless communications apparatus such as an access point, a station, a base station, or a user terminal.

The polar code in the embodiments of this application includes but is not limited to an Arikan polar code, and may alternatively be a CA-polar code or a PC-polar code. The Arikan polar is an original polar code not concatenated with another code, and includes only information bits and frozen bits. The CA-polar code is a polar code concatenated with a cyclic redundancy check (CRC for short), and the PC-polar code is a code concatenated with a parity check (PC for short). The PC-polar and the CA-polar are concatenated with different codes, to improve performance of the polar code.

In the examples described in the embodiments disclosed in this application, units and method processes may be implemented by electronic hardware or a combination of computer software and electronic hardware. Whether the functions are performed by hardware or software depends on particular applications and design constraint conditions of the technical solutions. A person skilled in the art can implement the described functions by using different methods for each specific application.

In the several embodiments provided in this application, it should be understood that the disclosed apparatus and method may be implemented in other manners. For example, the described apparatus embodiments are merely examples. For example, the unit division is merely logical function division and may be other division in actual implementation. For example, a plurality of units or components may be combined or integrated into another system, or some steps may be ignored or not performed. In addition, couplings or direct couplings or communication connections between the units may be implemented by using some interfaces, and these interfaces may be implemented in electronic, mechanical, or other forms.

The units described as separate parts may or may not be physically separate, and may be located in one location or may be distributed on a plurality of network units.

In addition, function units in the embodiments of this application may be integrated into one processing unit, or each of the units may exist alone physically, or two or more units may be integrated into one unit.

All or some of the foregoing embodiments may be implemented by using software, hardware, firmware, or any combination thereof. When being implemented by using software, all or some of the embodiments may be implemented in a form of a computer program product. The computer program product includes one or more computer instructions. When the computer program instructions are loaded and executed on a computer, all or some of the procedures or functions according to the embodiments of the present disclosure are generated. The computer may be a general-purpose computer, a special-purpose computer, a computer network, or other programmable apparatuses. The computer instructions may be stored in a computer readable storage medium or transmitted from a computer readable storage medium to another computer readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer readable storage medium may be any available medium accessible to the computer, or a data storage device, such as a server or a data center integrating one or more available media. The usable medium may be a magnetic medium (for example, a soft disk, a hard disk, or a magnetic tape), an optical medium (for example, a DVD), a semiconductor medium (for example, a solid state disk Solid State Disk (SSD)), or the like.

What is claimed is:

1. A polar code interleaving processing method, the method comprising:
   determining N to-be-encoded bits, wherein N is a positive integer;
   obtaining a first sequence that comprises sequence numbers of N polarized channels, wherein the first sequence is used to indicate a reliability order of the N polarized channels;
   performing polar encoding on the N to-be-encoded bits to obtain encoded bits; and
   interleaving the encoded bits based on the first sequence,
   wherein after the performing polar encoding on the N to-be-encoded bits to obtain encoded bits, the method further comprises:
   performing rate matching on the encoded bits to obtain rate-matched encoded bits; and
   the interleaving the encoded bits based on the first sequence comprises:
   sorting the rate-matched encoded bits based on a second sequence to obtain sorted encoded bits, wherein the second sequence is a sequence that has a length of M and that is obtained from the first sequence, M represents a length of a target code output from a polar code, and M is a positive integer; and
   wherein interleaving the encoded bits based on the first sequence includes inputting the sorted encoded bits into an interleaver to obtain interleaved bits,
   wherein the method further comprises sending a signal including the interleaved bits to a communications apparatus.

2. The method according to claim 1, wherein the interleaving the encoded bits based on the first sequence comprises:
   inputting elements in the first sequence into an interleaver to obtain an interleaved sequence; and
   sorting the encoded bits based on the interleaved sequence to obtain the interleaved bits.

3. The method according to claim 1, wherein the interleaving the encoded bits based on the first sequence comprises:
   sorting the encoded bits based on the first sequence to obtain sorted encoded bits; and
   inputting the sorted encoded bits into an interleaver to obtain the interleaved bits.

4. The method according to claim 3, wherein the inputting the sorted encoded bits into an interleaver to obtain the interleaved bits comprises:
   directly inputting the sorted encoded bits into the interleaver to obtain the interleaved bits.

5. The method according to claim 3, wherein the inputting the sorted encoded bits into an interleaver to obtain the interleaved bits comprises:
   performing rate matching on the sorted encoded bits to obtain rate-matched encoded bits; and
   inputting the rate-matched encoded bits into the interleaver to obtain the interleaved bits.

6. The method according to claim 1, wherein the interleaving the encoded bits based on the first sequence comprises:
   determining, in the first sequence, a location of an information bit and a location of a non-information bit based on a quantity K of information bits in the N to-be-encoded bits, wherein K is a positive integer less than or equal to N;
   inputting a first encoded bit at the location of the information bit in the encoded bits into a first interleaver to obtain first interleaved bits; and
   inputting a second encoded bit at the location of the non-information bit in the encoded bits into a second interleaver to obtain second interleaved bits.

7. The method according to claim 1, wherein the interleaving the encoded bits based on the first sequence comprises:
   sorting the encoded bits based on the first sequence to obtain a first sorting result; and
   after the performing polar encoding on the N to-be-encoded bits to obtain encoded bits, the method further comprises:
   performing repetition encoding on the encoded bits to obtain (M−N) repeated bits, wherein M represents a length of target code output from a polar code, and M is a positive integer greater than N;
   sorting the repeated bits based on the first sequence to obtain a second sorting result; and
   interleaving the first sorting result and the second sorting result to obtain the interleaved bits.

8. The method according to claim 7, wherein L=⌊M/N⌋, and the sorting the repeated bits based on the first sequence to obtain a second sorting result comprises:
   when L=1, sorting the repeated bits based on a second sequence to obtain the second sorting result, wherein the second sequence is a sequence that has a length of M−N and that is obtained from the first sequence; or
   when L>1, dividing the repeated bits into L segments of repeated bits, sorting each segment of repeated bits in first (L−1) segments of repeated bits based on the first sequence, and sorting an $L^{th}$ segment of repeated bits based on a second sequence, wherein a length of each segment of repeated bits in the first (L−1) segments of repeated bits is N, a length of the $L^{th}$ segment of repeated bits is M−L*N, and the second sequence is a sequence that has a length of M−L*N and that is obtained from the first sequence.

9. The method according to claim 7, wherein the interleaving the first sorting result and the second sorting result to obtain interleaved bits comprises:
   inputting the first sorting result into a first interleaver to obtain first interleaved bits; and
   inputting the second sorting result into a second interleaver to obtain second interleaved bits, wherein the first interleaved bits and the second interleaved bits form the interleaved bits.

10. A polar code interleaving processing apparatus, comprising:
    a memory storing instructions; and
    a processor configured to execute the instructions, wherein execution of the instructions by the processor causes the processor to:
    determine N to-be-encoded bits, wherein N is a positive integer;
    obtain a first sequence that comprises sequence numbers of N polarized channels, wherein the first sequence is used to indicate a reliability order of the N polarized channels;
    perform polar encoding on the N to-be-encoded bits to obtain encoded bits;
    perform rate matching on the encoded bits to obtain rate-matched encoded bits;
    sort the rate-matched encoded bits based on a second sequence to obtain sorted encoded bits, wherein the second sequence is a sequence that has a length of M and that is obtained from the first sequence, M represents a length of a target code output from a polar code, and M is a positive integer; and
    input the sorted encoded bits into an interleaver to obtain interleaved bits; and
    send a signal including the interleaved bits to a communications apparatus.

11. The apparatus according to claim 10, wherein execution of the instructions by the processor further causes the processor to:
    input elements in the first sequence into the interleaver to obtain an interleaved sequence; and
    sort the encoded bits based on the interleaved sequence to obtain the interleaved bits.

12. The apparatus according to claim 10, wherein execution of the instructions by the processor further causes the processor to:
    determine, in the first sequence, a location of an information bit and a location of a non-information bit based on a quantity K of information bits in the N to-be-encoded bits, wherein K is a positive integer less than or equal to N;
    input a first encoded bit at the location of the information bit in the encoded bits into a first interleaver to obtain first interleaved bits; and
    input a second encoded bit at the location of the non-information bit in the encoded bits into a second interleaver to obtain second interleaved bits.

13. The apparatus according to claim 10, wherein execution of the instructions by the processor further causes the processor to:
    sort the encoded bits based on the first sequence to obtain sorted encoded bits; and
    input the sorted encoded bits into the interleaver to obtain the interleaved bits.

14. The apparatus according to claim 13, wherein execution of the instructions by the processor further causes the processor to:
    perform rate matching on the sorted encoded bits to obtain rate-matched encoded bits; and
    input the rate-matched encoded bits into the interleaver to obtain the interleaved bits.

15. The apparatus according to claim 13, wherein execution of the instructions by the processor further causes the processor to:
    directly input the sorted encoded bits into the interleaver to obtain the interleaved bits.

16. A non-transitory computer-readable storage medium that stores instructions, which when executed by a processor cause the processor to:
    determine N to-be-encoded bits, wherein N is a positive integer;
    obtain a first sequence that comprises sequence numbers of N polarized channels, wherein the first sequence is used to indicate a reliability order of the N polarized channels;
    perform polar encoding on the N to-be-encoded bits to obtain encoded bits;
    perform rate matching on the encoded bits to obtain rate-matched encoded bits;
    sort the rate-matched encoded bits based on a second sequence to obtain sorted encoded bits, wherein the second sequence is a sequence that has a length of M and that is obtained from the first sequence, M represents a length of target code output from a polar code, and M is a positive integer; and
    input the sorted encoded bits into an interleaver to obtain interleaved bits; and
    send a signal including the interleaved bits to a communications apparatus.

17. The computer-readable storage medium according to claim 16, wherein the interleaving the encoded bits based on the first sequence comprises:
   inputting elements in the first sequence into an interleaver to obtain an interleaved sequence; and
   sorting the encoded bits based on the interleaved sequence to obtain the interleaved bits.

18. The computer-readable storage medium according to claim 16, wherein the interleaving the encoded bits based on the first sequence comprises:
   sorting the encoded bits based on the first sequence to obtain sorted encoded bits; and
   inputting the sorted encoded bits into an interleaver to obtain the interleaved bits.

19. The computer-readable storage medium according to claim 18, wherein the inputting the sorted encoded bits into an interleaver to obtain the interleaved bits comprises:
   directly inputting the sorted encoded bits into the interleaver to obtain the interleaved bits.

20. The computer-readable storage medium according to claim 18, wherein the inputting the sorted encoded bits into an interleaver to obtain the interleaved bits comprises:
   performing rate matching on the sorted encoded bits to obtain rate-matched encoded bits; and
   inputting the rate-matched encoded bits into the interleaver to obtain the interleaved bits.

* * * * *